United States Patent
Wiggermann et al.

(10) Patent No.: US 6,437,283 B1
(45) Date of Patent: Aug. 20, 2002

(54) DEVICE AND METHOD FOR PROCESSING SUBSTRATES

(75) Inventors: Udo Wiggermann, Marienthal (FR); Alex Schreiner, Austin, TX (US); Hans Jürgen Mayer, Viernheim (DE); Leo Higgins, Austin, TX (US); Eddy Roelants, Brügge (BE)

(73) Assignee: Siemens Aktiengesellschaft, Munich (DE)

(*) Notice: Subject to any disclaimer, the term of this patent is extended or adjusted under 35 U.S.C. 154(b) by 42 days.

(21) Appl. No.: 09/725,348

(22) Filed: Nov. 29, 2000

Related U.S. Application Data

(60) Provisional application No. 60/167,921, filed on Nov. 29, 1999.

(51) Int. Cl.[7] .............................................. B23K 26/38
(52) U.S. Cl. ............................... 219/121.7; 219/121.71; 219/121.76
(58) Field of Search ..................... 219/121.65, 121.66, 219/121.67, 121.68, 121.69, 121.7, 121.71, 121.76

(56) References Cited

U.S. PATENT DOCUMENTS

| | | | | |
|---|---|---|---|---|
| 4,789,770 A | * | 12/1988 | Kasner et al. | 219/121.7 |
| 4,839,497 A | * | 6/1989 | Sankar et al. | 219/121.71 |
| 5,194,713 A | * | 3/1993 | Egitto et al. | 219/121.71 |
| 6,229,113 B1 | * | 5/2001 | Brown | 219/121.7 |

* cited by examiner

*Primary Examiner*—Samuel M. Heinrich
(74) *Attorney, Agent, or Firm*—Laurence A. Greenberg; Werner H. Stemer; Ralph E. Locher

(57) ABSTRACT

When a laser beam is focussed onto a substrate for the purpose of substrate processing, the optical units such as beam expander, deflecting unit, and optical imaging device prescribe the range of depth of focus in which it is possible to work with a minimum spot size. The difficulty of boring thin holes, especially in thick substrates, is overcome with a second laser beam that is widened via a second beam expander and likewise focused onto the substrate via the deflecting unit and the optical imaging device. The position and the length of the second range of depth of focus can be varied by selecting the magnification of the second beam expander or by maladjustment. Thin holes can also be bored into thick substrates by using the two laser beams one after another.

14 Claims, 2 Drawing Sheets

DEVICE AND METHOD FOR PROCESSING SUBSTRATES

This application claims benefit of provisional application 60/167,921, filed Nov. 29, 1999.

BACKGROUND OF THE INVENTION

Field of the Invention

The invention relates to a device for processing substrates. The device has a first laser source for generating a first laser beam, a first beam expander in the beam path of the first laser beam, a deflecting unit, and an optical imaging device. These are arranged in series in the beam path of the first laser beam and image the first laser beam on the substrate. The invention further pertains to a method in which such a device is used in the processing of substrates.

As a rule, use is made of standard lasers such as Nd:YAG, Nd:YVO$_4$, CO$_2$, argon ion or other lasers known per se when processing substrates by means of laser beams, for example when structuring metalized substrate surfaces or when boring contact holes in multilayer substrates. The output beams of these lasers are imaged on the substrate to be processed by a beam expander, a deflecting unit and an optical imaging device, mostly an f-theta lens with a focal length of between 150 mm and 50 mm.

In order to achieve as large an energy density as possible and a high resolution when processing the substrate, the energy of the laser is focused in this case on as small an area as possible, the so-called minimum spot size, which is be found in the focal plane of the optical imaging device on account of the laser beam incident on the optical imaging device from the beam expander as a parallel beam. Upstream and downstream of the focal plane, the spot size of the laser is larger, and therefore only a smaller energy density is achieved there. The spacing between the positions upstream and downstream of the focal plane of the two spot sizes which are regarded as just adequate for the processing, is denoted below as depth of focus. The depth of focus is yielded in a known way as a function of the wavelength of the laser light, the beam expansion and the focal length of the f-theta lens. In most applications, the depth of focus varies between 1 and 5 mm in the case of a wavelength of 1064 nm, and between 0.1 and 1 mm in the case of a wavelength of 266 nm.

When boring substrates with a thickness of the order of magnitude of the depth of focus, the problem now arises that because of the widening of the spot size at the border of the range of depth of focus, the hole is not characteristically cylindrical, but strongly conical. It is impossible to set the conicity of the hole because it is prescribed by the laser system used.

Various methods are known for changing the useful range of depth of focus. First, it would be possible to use a longer wavelength, but in this case—depending on the material of the substrate—thermal effects occur which are partially destructive and therefore undesireable. Another possibility consists in a smaller beam expansion upstream of the optical imaging device, which leads to a larger depth of focus but also to a larger spot size which is not fine enough in the case of the finest structures and/or holes. Third, the displacement of the substrate in the direction of the laser beam during the structuring and/or boring operation remains, in order thus to remain in the range of the depth of focus. However, the mechanical arrangements required for this are too slow to reach as large a throughput as possible (for example more than 100 bored holes per second).

SUMMARY OF THE INVENTION

It is accordingly an object of the invention to provide a method and device for processing substrates, which overcomes the above-mentioned disadvantages of the heretofore-known devices and methods of this general type and which specifies a flexible, low-cost device for boring different substrates, and an associated method for using such the device.

With the foregoing and other objects in view there is provided, in accordance with the invention, a device for processing substrates, comprising:

a first laser source for generating a first laser beam projecting along a first beam path;

a first beam expander disposed in the first beam path;

a deflecting unit and an optical imaging device disposed in series in the first beam path for imaging the first laser beam onto a substrate;

a second laser source for generating a second laser beam projecting along a second beam path;

a second beam expander disposed in the second beam path;

a deflecting assembly disposed in the second beam path and configured to deflect the second laser beam to the deflecting unit and to be imaged on the substrate via the deflecting unit and the optical imaging device; and wherein the first and second beam expanders are constructed such that, after the first and second laser beams are focussed by the optical imaging device, there exists a difference between minimum spot sizes of the first and second laser beams.

The expression "difference" with reference to the spot sizes means a difference in the position of the minimum spot sizes along a beam direction and/or a difference in the dimensions of the minimum spot sizes of the first and second laser beams.

The solution according to the invention ensures at least two different ranges of depth of focus which are used for processing different substrates.

In accordance with an added feature of the invention, the two laser sources are of identical design, as a result of which the two laser beams have the same wavelength, and the deflecting unit and the optical imaging device are to be designed only to this common wavelength.

In accordance with an additional feature of the invention, the second beam expander has a different magnification than the first beam expander, causing the minimum spot sizes of the first and second laser beams to differ. The different magnification of the beam expanders leads to two different ranges of depth of focus which can be used, for example, to achieve holes of different conicity.

In accordance with another feature of the invention, the second beam expander is maladjusted, as a result of which the position of the minimum spot of the second laser beam is displaced by comparison with the first laser beam. It is therefore possible to bore thin holes through thick substrates, since the divergence of the beam outside the range of depth of focus plays no role.

In accordance with a further feature of the invention, the second beam expander is variably maladjustable, such that the position of the minimum spot of the second laser beam is variably adjustable. By means of the variable maladjustment of the second beam expander the device can advantageously be adapted to substrates of different thickness.

In accordance with a preferred embodiment, the deflecting assembly comprises a deflection mirror and a semi-reflecting mirror.

With the above and other objects in view there is also provided, in accordance with the invention, a method of processing a substrate with the above-outlined device. The method comprises the following steps:

placing the device relative to a substrate and adjusting the positions of the minimum spot sizes to be located at different depths in the substrate;

boring a first hole in the substrate with the first laser beam substantially to the position of the minimum spot size of the first laser beam; and boring the hole further with the second laser beam.

In accordance with again an added feature of the invention, lasers are used with laser beams having mutually different wavelengths. The laser beams are preferably pulsed laser beams. By using different wavelengths it is possible, above all, to process multilayer substrates with wavelengths adapted to the respective layers.

In accordance with a concomitant feature of the invention, the laser beams are pulsed with mutually different pulse energies and/or mutually different pulse repetition rates. This feature adds further flexibility in the process.

Other features which are considered as characteristic for the invention are set forth in the appended claims.

Although the invention is illustrated and described herein as embodied in a device for processing substrates, and method using such a device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
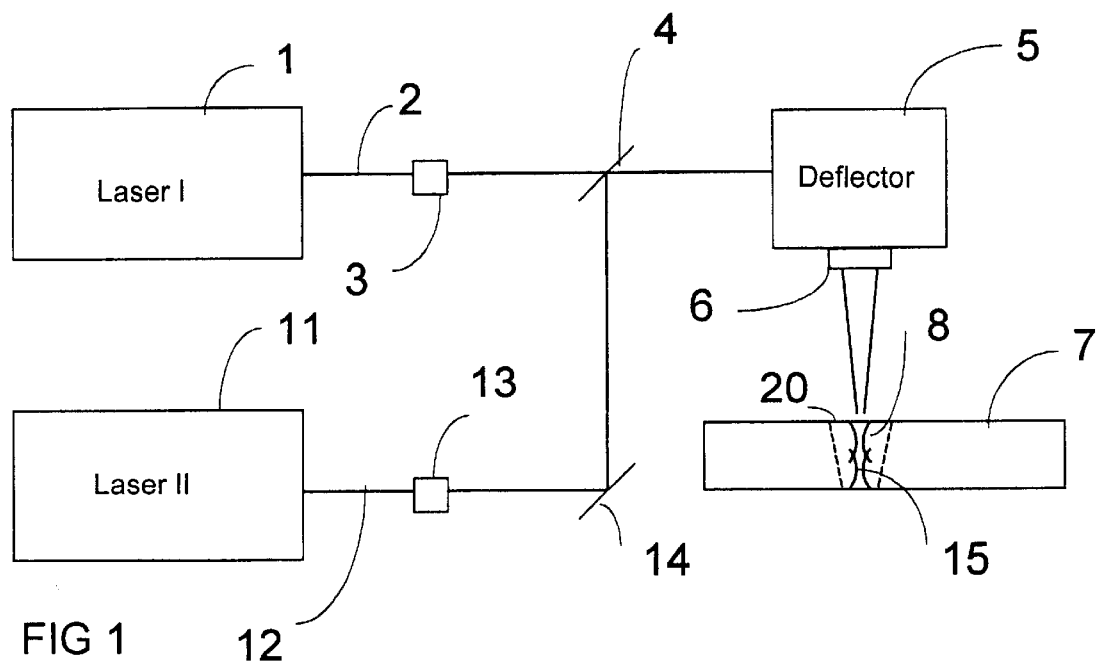
FIG. 1 is a diagrammatic side view of a device according to the invention.

Referring now to the figures of the drawing in detail and first, particularly, to FIG. 1 thereof, there is seen a device according to the invention in a diagrammatic side view. A first laser source 1 (for example a solid-state laser such as Nd:YAG or Nd:YVO4 or a gas laser such as CO2 or argon ion laser, or else another suitable laser) generates a first laser beam 2. The first laser beam 2 is expanded by means of a first beam expander 3. The first beam expander 3 in the beam path of the first laser beam 2 is represented in more detail in FIG. 4a. The beam expander 3 in this case comprises a first lens 24 and a second lens 25 and is designed in principle like a Kepler telescope, that is to say the focal points (f1: focal length of the first lens, f2: focal length of the second lens) coincide. If a thin beam 26 of parallel light rays now firstly falls through the first lens 24 with a short focal length f1 and subsequently through the second lens 25 with a longer focal length f2, the beam 27 thereafter has a larger diameter, and this is specified by the magnification factor of the beam expander 3.

Figure 4A:
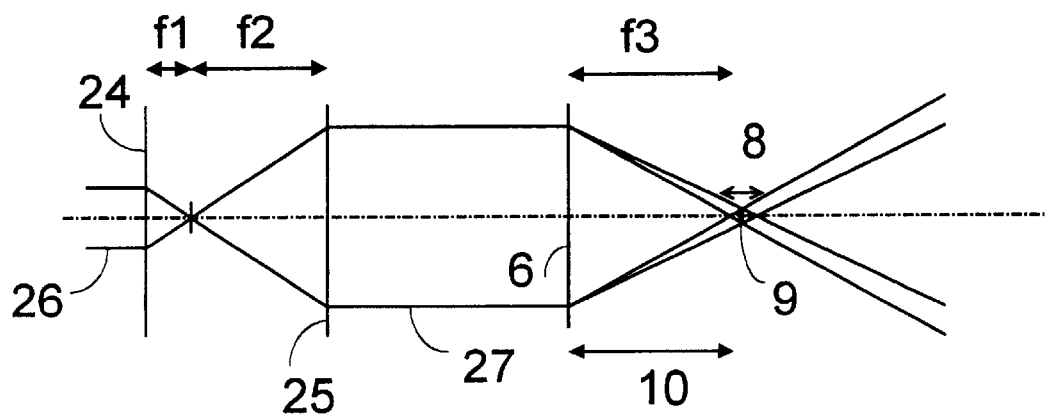
FIG. 4a is a beam path diagram for the first laser beam.

Referring once more to FIG. 1, the first laser beam 2 then passes through a semi-reflecting-mirror 4 (dichroic mirror) to a deflecting unit 5 which focuses the first laser beam 2 through a focusing optical system as optical imaging device 6 onto the substrate 7 to be processed. A hole 20 is thereby generated as a rule by a spiral or circular movement of the laser beam 2 over the surface of the substrate 7. The focusing optical system focuses the first laser beam 2 in the plane of the substrate up to a minimum spot size 9, the vertical position 10 of this minimum spot size 9 being given by the focal length f3 of the optical imaging device 6 (see FIG. 4a). In this case, use is made as optical imaging device 6 of a so-called f-theta lens, that is to say a lens in which the deflection in the substrate plane is proportional to the angle by which the laser beam 2 is deflected by the deflecting unit 5. A first range of depth of focus 8, which is sketched diagrammatically in FIGS. 1 and 4a, is yielded as a function of the diameter of the beam, the wavelength used for the laser beam 2 and the focal length of the optical imaging device 6. Outside the focal plane of the optical imaging device 6, the spot expands, and thus the diameter of the bored hole is enlarged and/or can no longer be so finely structured as with the minimum spot size 9.

According to the invention, a second laser source 11, which generates a second laser beam 12, is provided. This second laser beam is expanded via a second beam expander 13 and launched into the beam path of the first laser beam 2 via a mirror 14 and the semi-reflecting mirror 4, and thus reaches the substrate, likewise in a focused fashion, via the deflecting unit 5 and the optical imaging device 6. The semi-reflecting mirror 4 is constructed in this case to be transparent to the first laser beam 2 and reflecting for the second laser beam 12. The mirror 14 together with the semi-reflecting mirror 4 thus forms a deflecting assembly.

Figure 4B:
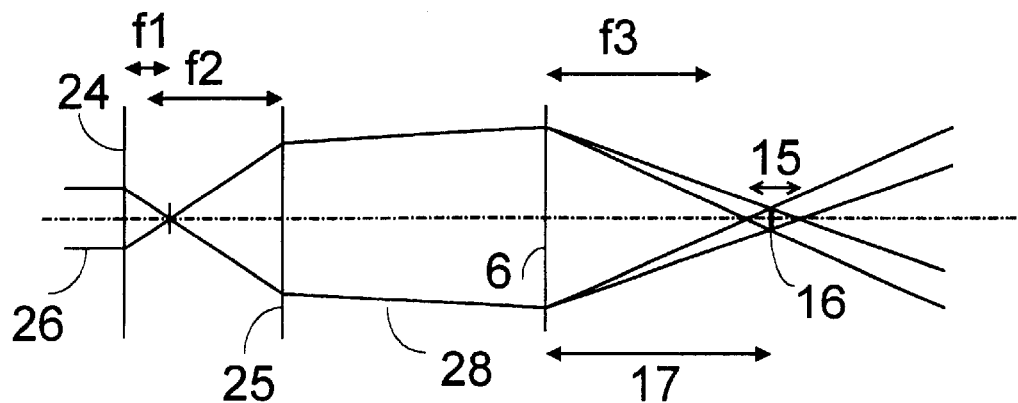
FIG. 4b is a beam path diagram for the second laser beam with a maladjusted second beam expander.

As represented in FIG. 4b, the second beam expander is selected in this case such that the range of depth of focus 15 of the second laser beam 12 occurs in a different position 17 than the range of depth of focus 8 of the first laser beam. Such a change in the position of the range of depth of focus can be achieved in the case of laser sources 1, 11 of otherwise identical design by virtue of the fact, for example, that the second beam expander 13 is slightly maladjusted, (the distance of the two lenses 24, 25 from one another being changed), so that the beam 28 emerging from the beam expander 13 is not comprised of parallel rays, but rays which are slightly divergent or convergent. The optical imaging device 6 then images such a divergent or convergent beam 28 in a plane downstream or upstream of, i.e., offset from, the focal plane. If the two lenses (24, 25) can be maladjusted variably relative to one another, the range of depth of focus (8, 15) can be changed correspondingly and set optimally to the desired processing operation.

Figure 4C:
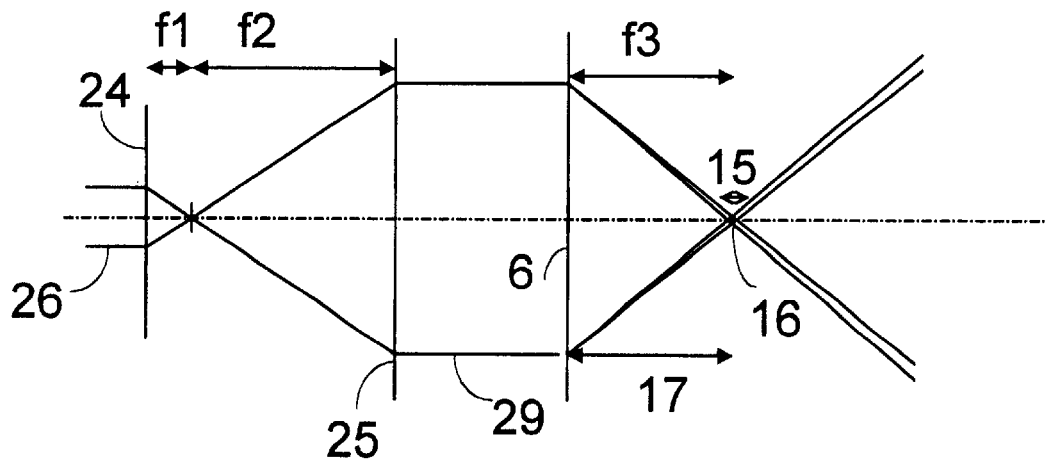
FIG. 4c is a beam path diagram for the second laser beam with a second beam expander with a different magnification factor.

With reference to FIG. 4c, different ranges of depth of focus can likewise be achieved by a changed magnification factor of the second beam expander 13. A larger magnification factor leads to a larger beam cross section of the emerging beam 29, and thus to a smaller minimum spot size 16 and a smaller range of depth of focus 15. Consequently, for example holes with walls of different conicity can be bored by means of a first beam expander 3 and a second beam expander 13 with different magnification factors. A prescribed conicity is, above all in the case of the metallic coating of holes for the purpose of achieving plated-through contacts, desired so as to achieve a coating which adheres as well as possible.

Figure 2:
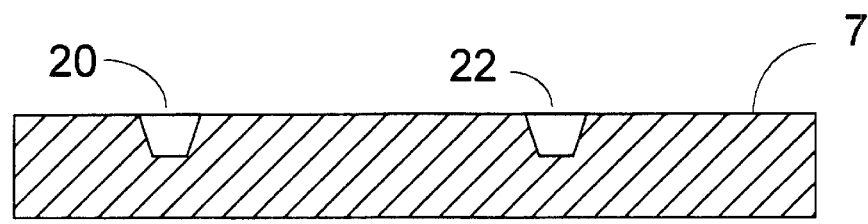
FIG. 2 is a section taken through a substrate with blind holes bored by means of the first laser beam.
Figure 3:
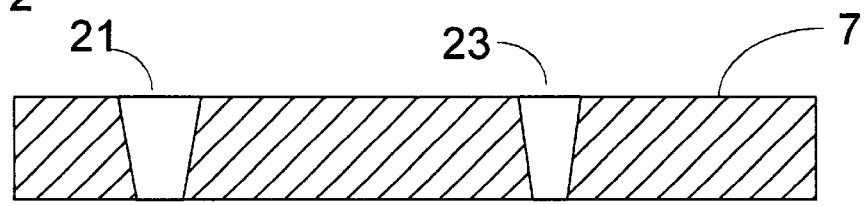
FIG. 3 is a similar section through a substrate whose blind holes, starting from FIG. 2, have been further bored with the first laser beam or further bored with a second laser beam.

Two steps of a process for boring holes in substrates are represented in cross section diagrammatically in FIGS. 2 and 3. The first laser beam 2 is thereby used to bore blind holes 20 and 22 into the substrate 7 up to the end of the range of depth of focus of the first laser beam 2. In the second step, it is now possible by using a second laser beam 12 with a second range of depth of focus to thin-bore the right-hand hole 23 further, while the left-hand hole 21 is bored further with the first laser beam 2 and becomes wider by leaving the range of depth of focus.

By using different wavelengths and/or different pulse repetition rates or pulse lengths of the two laser sources 1, 11, it is possible to tune the parameters for structuring multilayer substrates more effectively to the material properties of the respective layers.

The device and the method according to the invention can thus be used to bore thinner holes in thick substrates. It is also possible for deep structures to be more easily implemented thereby in thick substrates.

We claim:

1. A device for processing substrates, comprising:

a first laser source for generating a first laser beam projecting along a first beam path;

a first beam expander disposed in the first beam path;

a deflecting unit and an optical imaging device disposed in series in the first beam path for imaging the first laser beam onto a substrate;

a second laser source for generating a second laser beam projecting along a second beam path;

a second beam expander disposed in the second beam path;

a deflecting assembly disposed in the second beam path and configured to deflect the second laser beam to said deflecting unit and to be imaged on the substrate via said deflecting unit and said optical imaging device; and wherein said first and second beam expanders are constructed such that, after the first and second laser beams are focussed by said optical imaging device, there exists a difference between minimum spot sizes of the first and second laser beams.

2. The device according to claim 1, wherein the difference between the minimum spot sizes is a difference in position of the minimum spot sizes along a beam direction.

3. The device according to claim 1, wherein the difference between the minimum spot sizes is a difference in the dimensions of the minimum spot sizes of the first and second laser beams.

4. The device according to claim 1, wherein said first and second laser sources are of mutually identical design.

5. The device according to claim 1, wherein said second beam expander has a different magnification than said first beam expander, causing the minimum spot sizes of said first and second laser beams to differ.

6. The device according to claim 1, wherein said second beam expander is maladjusted such that the positions of the minimum spots of said first and second laser beams are displaced relative to one another.

7. The device according to claim 6, wherein said second beam expander is variably maladjustable, such that the position of the minimum spot of said second laser beam is variably adjustable.

8. The device according to claim 1, wherein said deflecting assembly comprises a deflection mirror and a semi-reflecting mirror.

9. A method of processing a substrate, which comprises:

placing a device according to claim 6 relative to a substrate and adjusting the positions of the minimum spot sizes to be located at different depths in the substrate;

boring a first hole in the substrate with the first laser beam substantially to the position of the minimum spot size of the first laser beam; and subsequently boring the hole further with the second laser beam.

10. The method according to claim 9, which comprises selecting lasers with laser beams having mutually different wavelengths.

11. The method according to claim 9, which comprises pulsing the laser beams.

12. The method according to claim 9, which comprises pulsing the laser beams with mutually different pulse energies and mutually different pulse repetition rates.

13. The method according to claim 9, which comprises pulsing the laser beams with mutually different pulse energies.

14. The method according to claim 9, which comprises pulsing the laser beams with mutually different pulse repetition rates.

* * * * *